United States Patent
Kawanabe et al.

(10) Patent No.: US 12,452,961 B2
(45) Date of Patent: Oct. 21, 2025

(54) CERAMIC STRUCTURE AND WAFER SYSTEM

(71) Applicant: KYOCERA CORPORATION, Kyoto (JP)

(72) Inventors: Yasunori Kawanabe, Kirishima (JP); Takeshi Muneishi, Kusatsu (JP); Yoshihiro Komatsu, Satsumasendai (JP); Yoshihiro Okawa, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 755 days.

(21) Appl. No.: 17/775,685

(22) PCT Filed: Nov. 6, 2020

(86) PCT No.: PCT/JP2020/041627
§ 371 (c)(1),
(2) Date: May 10, 2022

(87) PCT Pub. No.: WO2021/095667
PCT Pub. Date: May 20, 2021

(65) Prior Publication Data
US 2022/0394822 A1 Dec. 8, 2022

(30) Foreign Application Priority Data
Nov. 14, 2019 (JP) .................. 2019-206304

(51) Int. Cl.
*H05B 3/14* (2006.01)
*H05B 3/26* (2006.01)

(52) U.S. Cl.
CPC ............. *H05B 3/143* (2013.01); *H05B 3/262* (2013.01); *H05B 2203/002* (2013.01)

(58) Field of Classification Search
CPC ............... C04B 37/00; H01L 21/67103; H01L 21/6833; H01L 21/68785;
(Continued)

(56) References Cited

U.S. PATENT DOCUMENTS 6,261,708 B1 * 7/2001 Ohashi .................. C04B 37/005
428/328
2003/0150563 A1 * 8/2003 Kuibara ................ C04B 35/581
118/728

(Continued)

FOREIGN PATENT DOCUMENTS

JP H5-101871 A 4/1993
JP 2004-87392 A 3/2004
(Continued)

*Primary Examiner* — Sang Y Paik
(74) *Attorney, Agent, or Firm* — Procopio, Cory, Hargreaves & Savitch LLP

(57) ABSTRACT

A heater includes a base, a resistive heating body, and a terminal portion. The base is formed of ceramic and has a plate shape. The resistive heating body is located in the base. The terminal portion is electrically connected to the resistive heating body. The base includes a protruding portion surrounding the terminal portion, on a lower surface side. The protruding portion is formed of a ceramic member, and the terminal portion passes through a through hole formed in the ceramic member. The ceramic member is bonded to at least one of the lower surface of the base or the terminal portion.

20 Claims, 25 Drawing Sheets

(58) Field of Classification Search
CPC ........ H05B 2203/002; H05B 2203/003; H05B 2203/017; H05B 3/143; H05B 3/262; H05B 3/283
USPC ........................................................ 219/548
See application file for complete search history.

(56) References Cited

U.S. PATENT DOCUMENTS

2006/0191639 A1* 8/2006 Tanaka .............. H01L 21/68792
  156/345.52
2018/0204748 A1  7/2018 Unno et al.

FOREIGN PATENT DOCUMENTS

JP    2019-79774 A    5/2019
WO    2018/030433 A1  2/2018

* cited by examiner

CERAMIC STRUCTURE AND WAFER SYSTEM

TECHNICAL FIELD

The present disclosure relates to a ceramic structure and a wafer system including the ceramic structure.

BACKGROUND ART

A ceramic structure in which a wafer is to be superposed on an upper surface is known (for example, Patent Document 1 or 2). Such a ceramic structure includes a base formed of ceramic and having a plate shape, and an internal conductor located inside the base. The ceramic structure exhibits, for example, a function of heating the wafer, a function of adsorbing the wafer, a function of generating plasma around the wafer, or a combination of two or more of them by applying a voltage to the internal conductor. Such a ceramic structure is used in, for example, a semiconductor manufacturing device.

Patent Documents 1 and 2 disclose a ceramic heater provided with a resistive heating body as the internal conductor in the base formed of ceramic. The ceramic heater includes a terminal electrically connected to the internal conductor and exposed from a lower surface of the base. The lower surface of the base is planar, and a lower surface of the terminal is flush with the lower surface of the base.

CITATION LIST

Patent Literature

Patent Document 1: JP 2004-87392 A
Patent Document 2: JP H05-101871 A

SUMMARY OF INVENTION

A ceramic structure according to an aspect of the present disclosure includes a base, an internal conductor, a protruding portion, and a terminal portion. The base is formed of ceramic and has a plate shape, the base including an upper surface on which the wafer is superposed and a lower surface opposite to the upper surface. The internal conductor is located in the base. The protruding portion is formed on the lower surface of the base. The terminal portion is electrically connected to the internal conductor, at least partly located in the base and in the protruding portion, and is exposed to outside the protruding portion. The protruding portion is formed of a ceramic member, and the terminal portion passes through a through hole formed in the ceramic member. The ceramic member is bonded to at least one of the lower surface of the base or the terminal portion.

A wafer system according to one aspect of the present disclosure includes the above-described ceramic structure, an electrical power supply unit configured to supply electrical power to the terminal portion, and a controller configured to control the electrical power supply unit.

DESCRIPTION OF EMBODIMENTS

Figure 1:
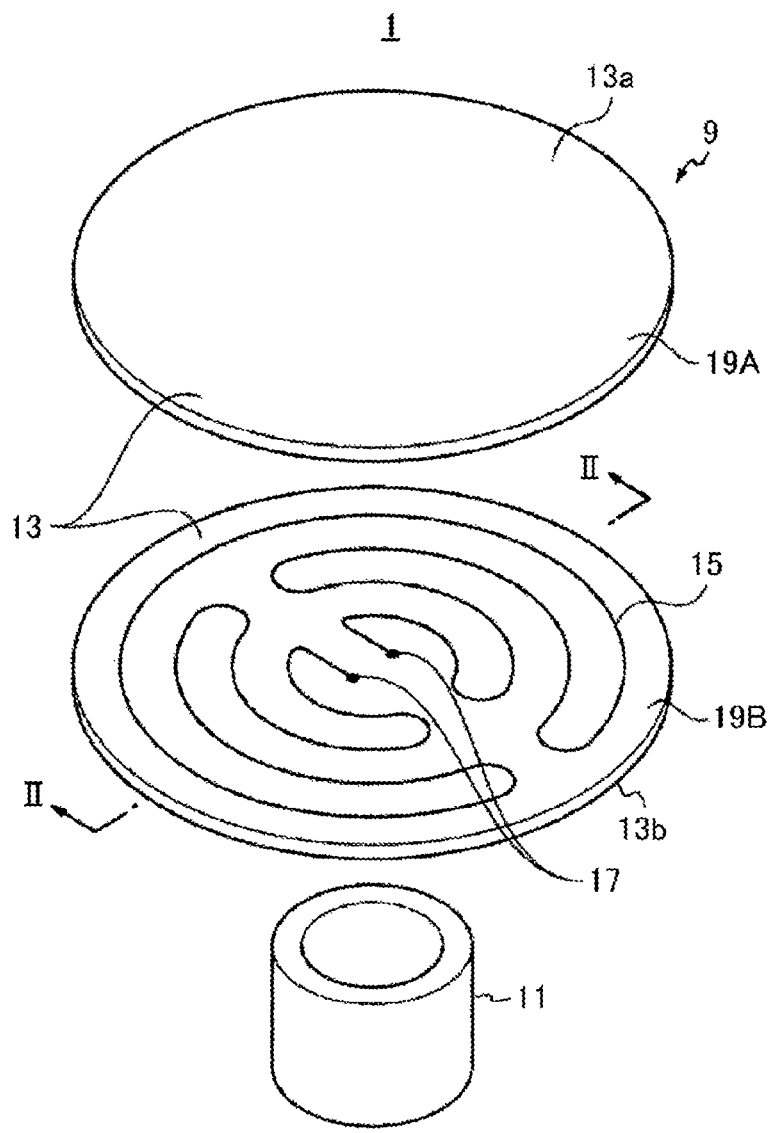
FIG. 1 is a schematic exploded perspective view illustrating a configuration of a heater according to an embodiment.

Hereinafter, a ceramic structure and a wafer system of the present disclosure will be described by taking a ceramic heater as an example. The drawings referred to below are schematic for convenience of description. Thus, the details may be omitted, and dimension ratios do not necessarily correspond to actual ones. The heater may further include known components not illustrated in each of the drawings.

In the second and subsequent embodiments, only differences from previously described embodiments will basically be described. The matters that are not particularly mentioned may be similar to those of the previously described embodiments. For convenience of description, configurations corresponding to each other among the plurality of embodiments may be denoted by the same reference numerals even when there are differences.

In the vertical cross-sectional view of one terminal portion and its surrounding configuration, unless otherwise specified, it may be regarded that the same vertical cross-sectional view is obtained when viewed from any direction around the one terminal portion (around the center line extending in the vertical direction on the paper).

A first embodiment will be described.

Heater System

Figure 2:
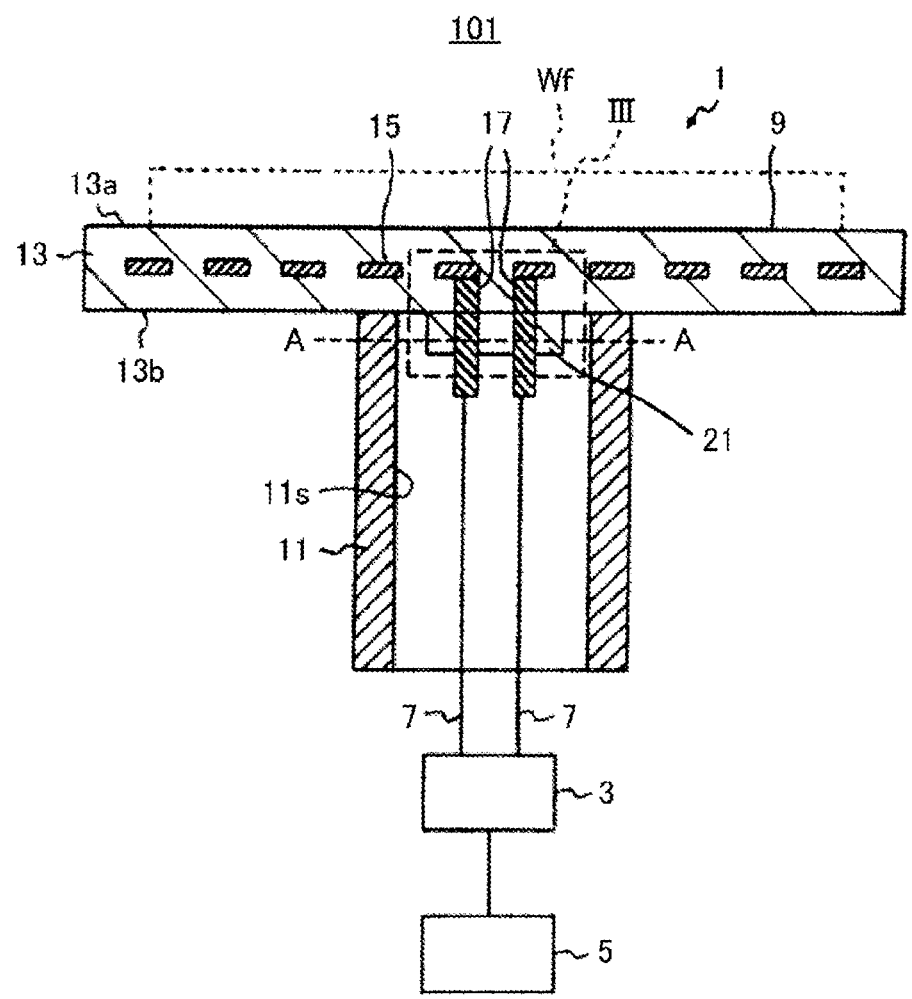
FIG. 2 is a cross-sectional view taken along a line II-II in FIG. 1.

FIG. 1 is a schematic exploded perspective view illustrating a configuration of a heater 1 according to an embodiment. FIG. 2 is a schematic view illustrating a configuration of a heater system 101 including the heater 1 in FIG. 1. In FIG. 2, a cross-sectional view taken along a line II-II in FIG. 1 is illustrated for the heater 1. FIG. 1 illustrates the heater 1 in an exploded state for convenience in order to illustrate a structure of the heater 1, and the actually completed heater 1 does not necessarily need to be able to be disassembled as illustrated in the exploded perspective view in FIG. 1.

The upper side of the paper in FIGS. 1 and 2 is, for example, the vertically upper side. Here, the heater 1 does not necessarily need to be used with the upper side of the paper in FIGS. 1 and 2 as the vertically upper side. Hereinafter, for convenience, terms such as an upper surface and a lower surface may be used with the upper side of the paper in FIGS. 1 and 2 as the upper side. Unless otherwise noted, when simply referred to as a plan view, it refers to a view from the upper side of the paper in FIGS. 1 and 2.

The heater system 101 includes the heater 1, an electrical power supply unit 3 (FIG. 2) for supplying electrical power to the heater 1, and a controller 5 (FIG. 2) for controlling the electrical power supply unit 3. The heater 1 and the electrical power supply unit 3 are connected to each other by wiring members 7 (FIG. 2). Note that the wiring members 7 may be regarded as a part of the heater 1. The heater system 101 may include, for example, a fluid supply unit for supplying gas and/or liquid to the heater 1, in addition to the configuration described above.

Heater

The heater 1 includes, for example, a heater plate 9 having a substantially plate shape (disk shape in the illustrated example) and a pipe 11 extending from the heater plate 9 to a lower side.

A wafer Wf (FIG. 2) serving as an example of an object to be heated is placed (superposed) on an upper surface 13a of the heater plate 9, and the heater plate 9 contributes directly to heating of the wafer. The pipe 11 contributes to, for example, support of the heater plate 9 and protection of the wiring members 7. Note that only the heater plate 9 may be regarded as the heater.

Heater Plate

The upper surface 13a and a lower surface 13b of the heater plate 9 are, for example, substantially planar. The planar shape and various dimensions of the heater plate 9 may be appropriately set in consideration of shapes, dimensions, and the like of the object to be heated. For example, the planar shape is a circular shape (illustrated in the example) or a polygonal shape (for example. rectangular). As an example of dimensions, the diameter is from 20 cm to 35 cm, and the thickness is from 4 mm to 30 mm.

The heater plate 9 includes, for example, a base 13 having insulating property, a resistive heating body 15 (an example of an internal conductor) embedded in the base 13, and terminal portions 17 for supplying electrical power to the resistive heating body 15. When a current flows through the resistive heating body 15, heat is generated according to Joule's law, and thus the wafer placed on the upper surface 13a of the base 13 is heated.

Base

An outer shape of the base 13 constitutes an outer shape of the heater plate 9. Accordingly, description of the shape and the dimensions of the heater plate 9 described above may be exactly regarded as a description of the outer shape and the dimensions of the base 13. A material of the base 13 is, for example, ceramic. The ceramic is a sintered body containing aluminum nitride (AlN), aluminum oxide ($Al_2O_3$, alumina), silicon carbide (SiC), silicon nitride ($Si_3N_4$), and the like as a main component, for example. Note that, the main component is, for example, a material that occupies 50% by mass or greater or 80% by mass or greater of the material (the same applies hereinafter).

In FIG. 1, the base 13 includes a first insulating layer 19A and a second insulating layer 19B. Note that the base 13 may be manufactured by layering materials (for example, ceramic green sheets) corresponding to the first insulating layer 19A and the second insulating layer 19B, respectively. The base 13 may be manufactured by a different method from the above-described method, and after completion, due to the presence of the resistive heating body 15 or the like, the base 13 may only be conceptually regarded as including the first insulating layer 19A and the second insulating layer 19B.

Thicknesses of these insulating layers may be set as appropriate, and a ratio of each insulating layer to a thickness of the base 13 may be appropriately set. As described below, the technique according to the present embodiment is applicable to a heater having a relatively thin thickness (thickness of the second insulating layer 19B) from the lower surface 13b of the base 13 to the internal conductor (resistive heating body 15) of the lowermost layer. An example of the thickness of such a relatively thin second insulating layer 19B is, for example, from 1 mm to 3 mm. In this case, the thickness of the base 13 may be, for example, from 4 mm to 6 mm.

Resistive Heating Body

The resistive heating body 15 extends along (for example, in parallel with) the upper surface 13a and the lower surface 13b of the base 13. The resistive heating body 15 extends, for example, across substantially the entire surface of the base 13 in a plan view. In FIG. 1, the resistive heating body 15 is located between the first insulating layer 19A and the second insulating layer 19B.

A specific pattern (path) of the resistive heating body 15 in a plan view may be set as appropriate. For example, only one resistive heating body 15 is provided in the heater plate 9, and extends from one end to the other end of the resistive heating body 15 without intersecting with itself. In the illustrated example, the resistive heating body 15 extends so as to reciprocate in a circumferential direction (in a meander shape) in each region obtained by dividing the heater plate 9 into two. Further, for example, the resistive heating body 15 may extend in a spiral shape, or may extend so as to linearly reciprocate in one radial direction.

The shape of the resistive heating body 15 when viewed locally may also be set as appropriate. For example, the resistive heating body 15 may be a layered conductor parallel to the upper surface 13a and the lower surface 13b, may have a coil shape (spring shape) wound around the above-described path serving as an axis, or may be formed in a mesh shape. The dimensions in various shapes may be appropriately set.

A material of the resistive heating body 15 is a conductor (for example, metal) that heats up when a current flows therethrough. The conductor may be appropriately selected and is, for example, tungsten (W), molybdenum (Mo), platinum (Pt), indium (In), or an alloy containing these as a main component. The material of the resistive heating body 15 may be obtained by firing a conductive paste including the metal as described above. In other words, the material of the resistive heating body 15 may include an additive (inorganic insulation from another viewpoint) such as glass powder and/or ceramic powder.

Protruding Portion

Figure 3A:
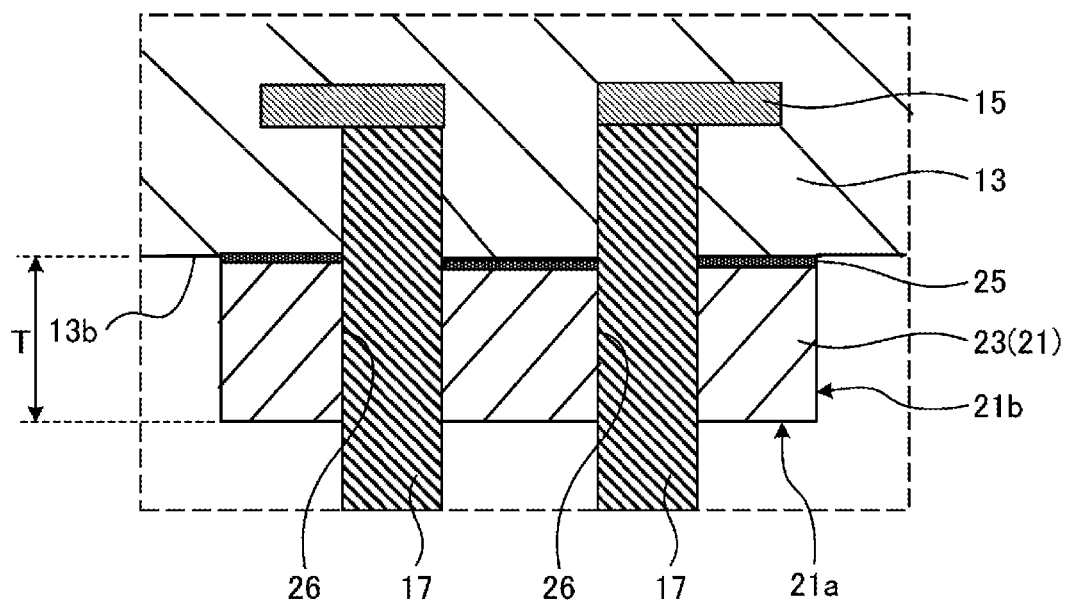
FIG. 3A is an enlarged cross-sectional view of a region III of the heater according to the embodiment.

FIG. 3A is an enlarged cross-sectional view of a region III of the heater in FIG. 2. The heater 1 includes a protruding portion 21 on the lower surface 13b of the base 13. The protruding portion 21 is a separate member from the base 13, and is bonded to the lower surface 13b of the base 13. A top surface 21a (surface closer to the lower side of the paper) of the protruding portion 21 constitutes a surface protruding from a part of the lower surface 13b. A side surface 21b of the protruding portion 21 is in contact with the lower surface 13b of the base 13.

Terminal Portion

Each of the terminal portions 17 is connected to, for example, a corresponding one of both ends of the resistive heating body 15 in the length direction, passes through a part (second insulating layer 19B) close to the lower surface 13b of the base 13 at the corresponding one of the both ends of the resistive heating body 15, further passes through the protruding portion 21, and is exposed to the top surface 21a of the protruding portion 21. Thus, electrical power can be supplied from outside the heater plate 9 to the resistive heating body 15. A pair of the terminal portions 17 (both ends of the resistive heating body 15) are located, for example, close to the center of the heater plate 9. Note that three or more terminal portions 17 for supplying the electrical power to one resistive heating body 15 may be provided, or two or more sets of the terminal portions 17 for supplying the electrical power to two or more (for example, two or more layers) resistive heating bodies 15 may be provided. As in the heater illustrated in FIGS. 2, 3A, and 3B, the terminal portions 17 may have a structure passing through the protruding portion 21 and extending from the top surface 21a.

Examples of a material of the terminal portions 17 include metals made of W, Mo, and Pt.

Pipe

The pipe 11 has a hollow shape whose upper and lower sides (both sides in the axial direction) are open. From another viewpoint, the pipe 11 includes a space 11s passing through the upper and lower sides. The protruding portion 21 is located inside the pipe 11. Shapes of a horizontal cross-section (cross-section orthogonal to the axial direction) and a vertical cross-section (cross-section parallel to the axial direction, cross-section illustrated in FIG. 2) of the pipe 11 may be set as appropriate. In the illustrated example, the pipe 11 has a cylindrical shape having a constant diameter with respect to a position in the axial direction. The pipe 11 may have a different diameter depending on a position in the height direction. A specific value of dimensions of the pipe 11 may be set as appropriate. Although not specifically illustrated, a channel through which a gas or a liquid flows may be formed in the pipe 11.

The pipe 11 may be formed of an insulating material such as ceramic, or may be formed of metal (electrically conductive material). As a specific material of the ceramic, for example, those exemplified in the description of the base 13 (AlN or the like) may be used. A material of the pipe 11 may be the same as or different from the material of the base 13.

The base 13 and the pipe 11 may be fixed to each other by an appropriate method. For example, both may be fixed to each other by an adhesive (not illustrated) interposed therebetween, may be fixed to each other by solid phase bonding without interposing the adhesive therebetween, or may be fixed to each other mechanically using a bolt and a nut (both not illustrated).

The adhesive may be an organic material, may be an inorganic material, may be an electrically conductive material, or may be an insulating material. Specifically, as the adhesive, for example, a glass-based adhesive may be used (glass bonding may be used). As the solid phase bonding, for example, diffusion bonding may be used. In the diffusion bonding, the base 13 and the pipe 11 are bonded to each other by being heated and pressurized. The diffusion bonding includes not only direct contact between the base 13 and the pipe 11, but also disposition of a material for promoting bonding between the base 13 and the pipe 11. The material may be in a solid state or may be in a liquid phase state during bonding.

Wiring Member

The wiring members 7 are inserted through the space 11s of the pipe 11. In a see-through plan view, in a region of the heater plate 9 exposed in the space 11s, a plurality of the terminal portions 17 are exposed to the protruding portion 21 formed on the lower surface 13b of the base 13. One end of each of the wiring members 7 is connected to a corresponding one of the plurality of terminal portions 17. The terminal portions 17 pass through the protruding portion 21, and in a case of a structure in which the terminal portions 17 further extend from the top surface 21a, the one end of each of the wiring members 7 is connected to an extended terminal end side of the corresponding one of the terminal portions 17.

A plurality of the wiring members 7 may be flexible wires, may have a rod shape without having flexibility, or may be a combination thereof. The plurality of the flexible wires may be bundled to form a single cable or may not be bundled. A method for connecting the wiring members 7 and the terminal portions 17 may also be selected as appropriate. For example, both may be bonded to each other by an electrically conductive bonding member. For example, both may be screwed together by forming a male screw on one side and forming a female screw on the other side.

Manufacturing Method of Heater

In a manufacturing method of the heater 1, for example, the heater plate 9, the pipe 11, the wiring members 7, and the like are manufactured separately from each other. Thereafter, these members are fixed to each other. Note that, some or all of the heater plate 9 and the pipe 11 may be manufactured together. A manufacturing method of the pipe 11 and the wiring members 7 may be, for example, similar to various known methods.

A manufacturing method of the heater plate 9 may be similar to various known methods except for a manufacturing method of the protruding portion 21. For example, the base 13 may be manufactured by firing a layered body of ceramic green sheets to be the first insulating layer 19A and the second insulating layer 19B in which the conductive paste to be the resistive heating body 15 is disposed. The base 13 may be manufactured by disposing the coil to be the resistive heating body 15 and ceramic raw material powder to be the base 13 in a mold and performing heating and pressurization (in other words, by a hot press method).

Subsequently, holes into which the terminal portions 17 are inserted are formed by, for example, drilling or the like, and then each of the terminal portions 17 is inserted into a corresponding one of the formed holes. At this time, a paste of an electrically conductive material such as platinum is preliminary applied to an end of each of the terminal portions 17. Subsequently, the electrically conductive material is sintered by heat treating the base 13 to which the terminal portions 17 are mounted in vacuum. The treatment temperature at this time is, for example, 1250° C.

Subsequently, the terminal portions 17 are inserted through a ceramic member 23 containing aluminum nitride as a main component. At this time, a paste of a bonding member 25 is applied to a bottom surface 21c of the ceramic member 23. The paste of the bonding member 25 is formed into a paste by adding a binder and a solvent to each of aluminum oxide ($Al_2O_3$) powder, calcium carbonate ($CaCO_3$) powder, and yttrium oxide ($Y_2O_3$) powder. For a composition of each powder contained in the bonding member 25, a content of Al in terms of aluminum oxide ($Al_2O_3$) is preferably from 40% by mass to 65% by mass, a content of Ca in terms of calcium oxide (CaO) is preferably from 30% by mass to 50% by mass, and a content of Y in terms of yttrium oxide ($Y_2O_3$) is preferably from 5% by mass to 15% by mass. The composition of each powder contained in the bonding member 25 is such that, for example, a content of Al in terms of aluminum oxide ($Al_2O_3$) is 50% by mass, a content of Ca in terms of calcium oxide (CaO) is 40% by mass, and a content of Y in terms of yttrium oxide ($Y_2O_3$) is 10% by mass.

Subsequently, the base 13 and the ceramic member 23 are heat treated in vacuum. The treatment temperature at this time is, for example, 1550° C. As a result, the bonding member 25 enters a gap between each of holes (through holes 26 or the like) for inserting a corresponding one of the terminal portions 17 and the corresponding one of the terminal portions 17, and the gap is sealed by the bonding member 25 (AlCaY). AlCaY is a compound (for example, $Y_2O_3$, $Al_3Y_5O_{12}$, $Ca_3Al_{10}O_{18}$, $CaAl_{12}O_{19}$) containing, for example, at least one of Al, Ca, and Y, and oxygen (O).

Sealing of Protruding Portion 21 and Base 13

As illustrated in FIG. 3A, the protruding portion 21 is formed of the ceramic member 23 serving as a separate member from the base 13. The ceramic member 23 includes the through holes 26 through which the terminal portions 17 are inserted.

Since the materials of the base 13 and the ceramic member 23 are both ceramic, a difference of thermal expansion coefficient between the base 13 and the ceramic member 23 is small, and thus thermal conductivity of the ceramic member 23 can be suppressed to a level equal to or less than that of the base 13. As a result, the heater 1 serving as the ceramic structure can further efficiently heat the upper surface 13a of the base 13.

The ceramic member 23 may be bonded (sealed) to the lower surface 13b by the bonding member 25. In another expression, the ceramic member 23 may be bonded to the lower surface 13b via the bonding member 25.

Here, "bonding" is a state in which the protruding portion 21 and the terminal portions 17 are bonded to each other by the bonding member, and as a result, a space between the protruding portion 21 and the terminal portions 17 are sealed, and airtightness is maintained. The "bonding" by the bonding member 25 produces an effect of "sealing" as a result.

A material of the bonding member 25 may be set as appropriate, and may be, for example, a common glass-based sealing material, or a $CaO$—$Al_2O_3$—$Y_2O_3$-based bonding member may be used. By interposing the bonding member 25 between the lower surface 13b and the ceramic member 23, the bonding member 25 accumulates heat, and this can make it difficult to transfer heat in a direction orthogonal to the lower surface 13b in the ceramic member 23. Thus, the heater 1 serving as the ceramic structure can efficiently heat the upper surface 13a of the base 13. The airtightness between the base 13 and the ceramic member 23 can be improved by the bonding member 25.

Sealing of Protruding Portion 21 and Terminal Portions 17

Figure 3B:
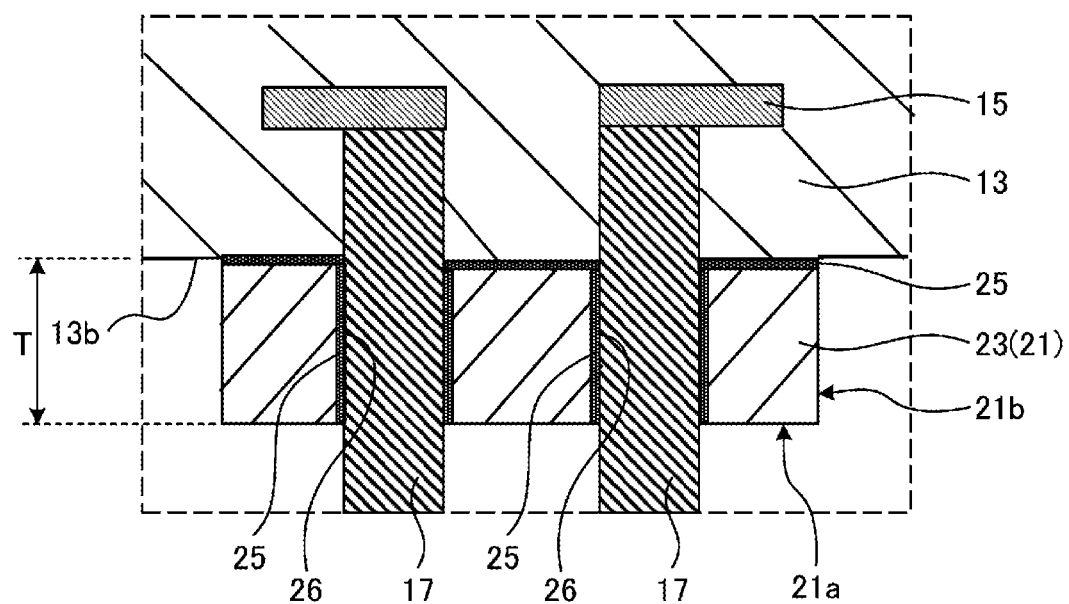
FIG. 3B is an enlarged cross-sectional view of the region III of the heater according to the embodiment.

As illustrated in FIG. 3B, the ceramic member 23 and the terminal portions 17 may be bonded by the bonding member 25. Since the airtightness can be maintained by sealing a gap between the ceramic member 23 and the terminal portions 17, for example, even when the terminal portions 17 are exposed to an oxidizing gas (for example, oxygen gas) at a high temperature, the oxygen gas does not enter from the periphery of the terminal portions 17, and thus the resistive heating body 15 is not oxidized.

Note that the ceramic member 23 is bonded to at least one of the lower surface 13b of the base 13 or the terminal portions 17. For example, FIG. 3A illustrates an example in which the ceramic member 23 is bonded only to the lower surface 13b of the base 13, and FIG. 3B illustrates an example in which the ceramic member 23 is bonded to both the lower surface 13b of the base 13 and the terminal portions 17. However, no such limitation is intended, and the ceramic member 23 may be bonded only to the terminal portions 17. This point will be described later.

The heater may be requested to effectively heat an object to be heated, and, at the same time, improvement in the airtightness at the terminal portions may also be requested. In response to this, the heater 1 serving as the ceramic structure according to the present embodiment includes the base 13, the internal conductor (resistive heating body 15), and the terminal portions 17. The base 13 is formed of ceramic and has the plate shape including the upper surface 13a on which the wafer Wf is superposed and the lower surface 13b opposite to the upper surface 13a. The resistive heating body 15 is located in the base 13. The terminal portions 17 are electrically connected to the resistive heating body 15, at least partially located in the base 13 and at the protruding portion 21, and exposed to outside the protruding portion 21. The protruding portion 21 is housed inside the pipe 11. The protruding portion 21 is formed of the ceramic member 23, and each of the terminal portions 17 passes through a corresponding one of the through holes 26 formed in the ceramic member 23. The ceramic member 23 is bonded to at least one of the lower surface 13b of the base 13 or the terminal portions 17.

Accordingly, for example, the heat generated by the resistive heating body 15 can be prevented from being transferred from the lower surface 13b side to the pipe 11 side by a heat accumulation effect of the protruding portion 21. As a result, the upper surface 13a of the base 13 can be efficiently heated. In a case where the protruding portion 21 and the terminal portions 17 are bonded (sealed) to each other, the airtightness around the terminal portions 17 can be improved. As a result, corrosion of the resistive heating body 15 is prevented, and the heater 1 having a small temperature change of the upper surface 13a of the base 13 for a long period of time can be formed.

Figure 4A:
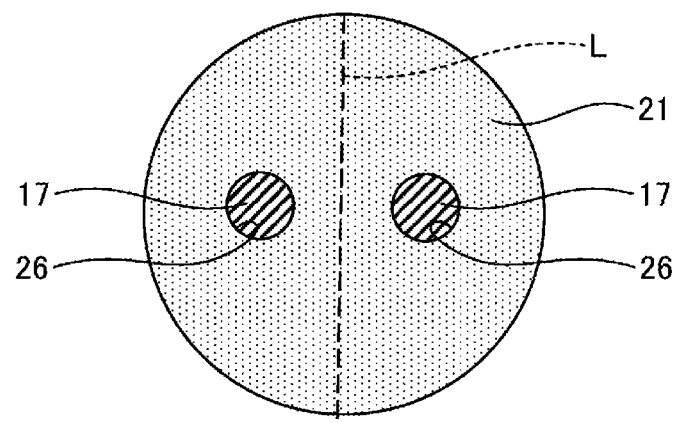
FIG. 4A is a view illustrating an example of a cross-section of a protruding portion and a terminal portion taken along a line A-A in FIG. 2.
Figure 4B:
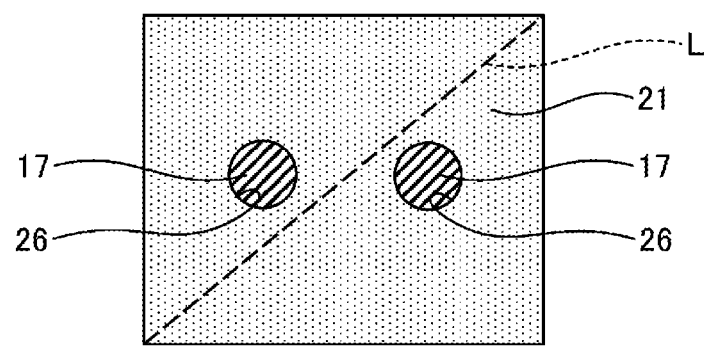
FIG. 4B is a view illustrating an example of a cross-section of a protruding portion and a terminal portion taken along the line A-A in FIG. 2.
Figure 4C:
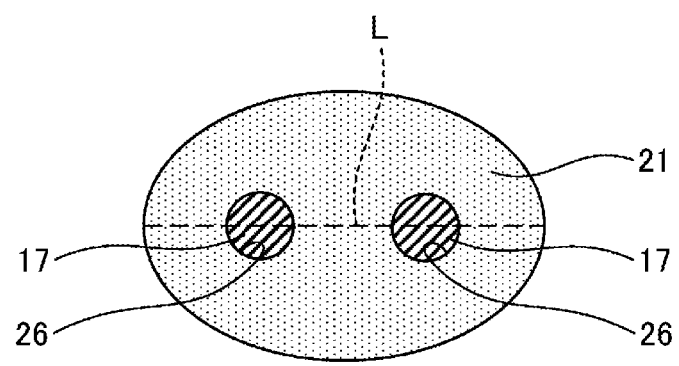
FIG. 4C is a view illustrating an example of a cross-section of a protruding portion and a terminal portion taken along the line A-A in FIG. 2.

Next, a second embodiment will be described. FIGS. 4A to 4C are views illustrating an example of a cross-section of the protruding portion 21 and the terminal portions 17 taken along a line A-A in FIG. 2. As illustrated in FIG. 4A, the protruding portion 21 may have a contour of a circle with a diameter L in a cross-sectional view in a plane parallel to the lower surface 13*b*. The shape of the circle here need not be strictly a circle, and may a substantially circular shape. The circle here, includes a shape in which a part of the contour of the circle is partially missing, and the missing part is formed of a straight line or the like.

As illustrated in FIG. 4B, the protruding portion 21 may have a contour of a quadrilateral in the cross-sectional view in the plane parallel to the lower surface 13*b*. The quadrilateral referred to herein also includes a shape in which corner portions of the quadrilateral are curved shapes, and a shape in which the corner portions of the quadrilateral have C-planes. Although not illustrated, the protruding portion 21 may have a contour of a polygon other than the quadrilateral in the cross-sectional view in the plane parallel to the lower surface 13*b*.

As illustrated in FIG. 4C, the protruding portion 21 may have a contour of an ellipse in the cross-sectional view in the plane parallel to the lower surface 13*b*. The ellipse referred to here also includes a shape obtained by connecting three or more convex curved lines having different radius of curvature.

The contour of the protruding portion 21 is one of the circle, the ellipse, or the polygon, and thus the heat generated in the resistive heating body 15 and accumulated in the protruding portion 21 is easily transferred from the protruding portion 21 uniformly to the lower side. As a result, the upper surface 13*a* of the base 13 can be further efficiently heated.

Although not illustrated, even when the contour of the protruding portion 21, when the protruding portion 21 is viewed in the cross-sectional view in the plane parallel to the lower surface 13*b*, is formed of a combination of parts of two or more contours of a part of the contour of the circle, a part of the contour including the corner of the polygon, and a part of the contour of the ellipse, the upper surface 13*a* of the base 13 can be further efficiently heated, similarly.

Next, a third embodiment will be described. As illustrated in FIG. 3, a thickness of the protruding portion 21 may be a constant value T. From another viewpoint, the top surface 21*a* of the protruding portion 21 may be parallel to the lower surface 13*b*. In a case where the thickness of the protruding portion 21 is constant, heat generated by the resistive heating body 15 is easily accumulated uniformly in the protruding portion 21. As a result, the heater 1 serving as the ceramic structure can further efficiently heat the upper surface 13*a* of the base 13.

Next, a fourth embodiment will be described. When a line segment formed of a virtual straight line is drawn on a contour of a cross-section illustrated in each of FIGS. 4A to 4C and inside the contour, the protruding portion 21 has a maximum value L of the length of the line segment greater than the thickness T. In the case of FIG. 4A, the contour of the cross-section A-A of the protruding portion 21 is circular, and thus the line segment length L is constant regardless of the position of the virtual straight line. In the case of FIG. 4B, the contour of the cross-section A-A of the protruding portion 21 is a quadrilateral, and thus the line segment length L is a length between vertices facing each other through the inside of the quadrilateral. In the case of FIG. 4C, the line segment length L is a length of a line segment connecting parts having smaller radius of curvature of the ellipse to each other.

The maximum value L of the length of the line segment is greater than the thickness T of the protruding portion 21, and thus the heat generated by the resistive heating body 15 is more likely to be uniformly accumulated throughout the top surface 21*a* side after the heat is transmitted to the protruding portion 21. Thus, the heater 1 serving as the ceramic structure can further efficiently heat the upper surface 13*a* of the base 13.

A value of L/T is preferably 2 or greater, and even more preferably 4 or greater.

Next, a fifth embodiment will be described. A content of calcium in terms of calcium oxide in the ceramic member 23 may be 0.03% by mass or less. A content of yttrium in terms of yttrium oxide in the ceramic member 23 may be 0.3% by mass or less. With this configuration, the occurrence of cracks in the ceramic member 23 can be suppressed. This point will be described below.

The ceramic member 23 contains aluminum nitride as a main component. For example, calcium oxide (CaO) and yttrium oxide ($Y_2O_3$) may be used as a sintering aid for ceramic containing aluminum nitride as the main component. In other words, calcium and yttrium may be contained in the ceramic containing aluminum nitride as the main component.

Here, calcium in the bonding member 25 may diffuse into the ceramic member 23. When calcium diffuses into the ceramic member 23, the thermal expansion coefficient of the ceramic member 23 increases in a part where calcium diffuses. As a result, a difference between the thermal expansion coefficient of the ceramic member 23 and the thermal expansion coefficient of the terminal portions 17 increases. Since the ceramic member 23 and the terminal portions 17 are bonded to each other via the bonding member 25, for example, when heating and cooling are repeated, thermal stress is applied to the ceramic member 23 due to the difference in thermal expansion between the terminal portions 17 and the ceramic member 23, and thus the possibility of occurrence of cracks in the ceramic member 23 increases.

In contrast, in a case where the amount of calcium contained in the ceramic member 23 is reduced, the difference between the thermal expansion coefficient of the ceramic member 23 and the thermal expansion coefficient of the terminal portions 17 can be reduced. Thus, even when the calcium in the bonding member 25 diffuses into the ceramic member 23, the difference between the thermal expansion coefficient of the ceramic member 23 and the thermal expansion coefficient of the terminal portions 17 can be prevented from becoming too large.

The present inventors confirm that the lower the calcium content in the ceramic member 23, the more the diffusion of calcium from the bonding member 25 to the ceramic member 23 is suppressed. Specifically, as a result of comparing a degree of the diffusion of calcium from the bonding member 25 between a ceramic member (ceramic member with a sintering aid) manufactured using a sintering aid containing approximately 0.2% by mass of the calcium oxide and approximately 3% by mass of the yttrium oxide and a ceramic member (ceramic member without the sintering aid) manufactured without using the sintering aid by using an electron probe microanalyzer (EPMA), it is confirmed that the diffusion of calcium is clearly lower in the ceramic member without the sintering aid. In other words, by reducing the amount of calcium contained in the ceramic member 23, the diffusion itself of calcium in the bonding member 25 into the ceramic member 23 can be suppressed.

As described above, by reducing the amount of calcium contained in the ceramic member 23, the occurrence of cracks in the ceramic member 23 can be suppressed. Specifically, the content of calcium in terms of calcium oxide in the ceramic member 23 is preferably 0.03% by mass or less.

Next, a sixth embodiment will be described. The ceramic member 23 may be formed of ceramic including the same material as the base 13. In a case where the ceramic member 23 and the base 13 are formed of ceramic including the same material, the thermal expansion coefficients of the base 13 and the ceramic member 23 can be matched or substantially matched. Thus, the heater 1 serving as the ceramic structure can efficiently heat the upper surface 13*a* of the base 13, and can mitigate the difference in thermal expansion between the base 13 and the ceramic member 23, thus suppressing the occurrence of cracks in the base 13 or the ceramic member 23.

Next, a seventh embodiment will be described. The bonding member 25 may contain a metal element A constituting the main component of the base 13 and a metal element B constituting the sintering aid contained in the base 13. In this case, the sum of the metal element A and the metal element B constitutes the main component of the bonding member 25.

According to such a configuration, the heater 1 serving as the ceramic structure can efficiently heat the upper surface 13*a* of the base 13, and can improve bonding strength between the base 13 and the ceramic member 23.

Next, an eighth embodiment will be described. The metal element A may be Al. The metal element B may be Y and Ca. As a result, the heater 1 serving as the ceramic structure can efficiently heat the upper surface 13*a* of the base 13, and can improve corrosion resistance of the base 13 and the ceramic member 23.

Next, a ninth embodiment will be described. In a case where the metal element A is aluminum (Al), the main component of the base 13 and the ceramic member 23 may be aluminum nitride (AlN). The metal element B may be yttrium (Y) and calcium (Ca). These metal elements are set to the metal element A and the metal element B, and thus the upper surface 13*a* of the base 13 can be efficiently heated and the bonding strength between the base 13 and the ceramic member 23 can be improved.

Figure 5A:
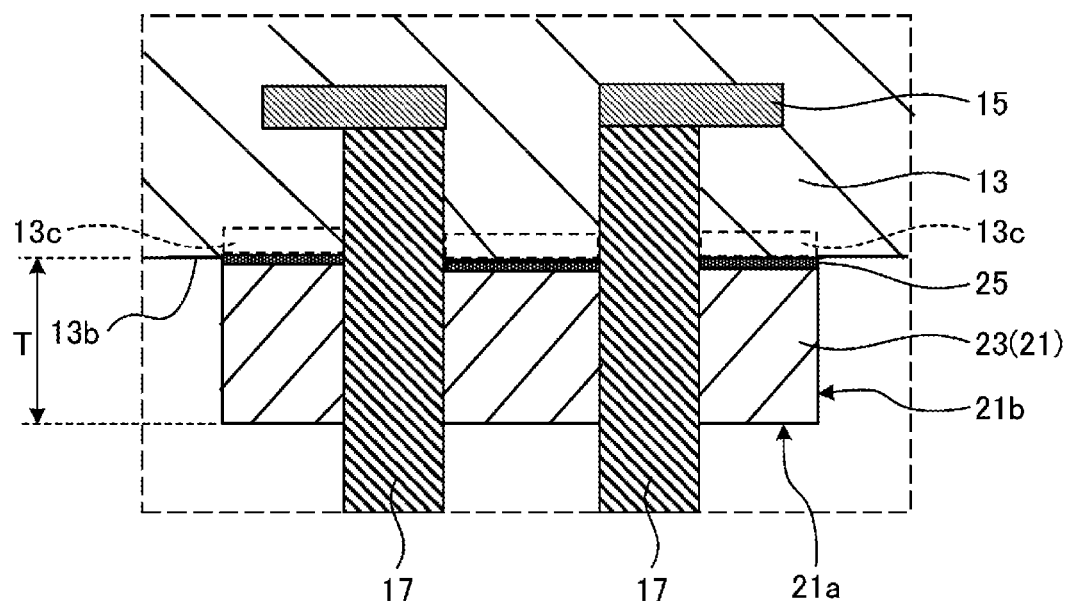
FIG. 5A is an enlarged cross-sectional view of the region III of the heater according to another embodiment.

Next, a tenth embodiment will be described. In FIG. 5A, a surface portion 13*c* of the base 13 facing the ceramic member 23 is added to the structure in FIG. 3A. The surface portion 13*c* refers to a range from the lower surface 13*b* to a depth of 100 μm in a part of the base 13 facing the ceramic member 23. A content of the metal element B in the surface portion 13*c* of the base 13 facing the ceramic member 23 is greater than a content of the metal element B inside the base 13. Thus, the heater 1 serving as the ceramic structure can efficiently heat the upper surface 13*a* of the base 13, and can improve the bonding strength between the base 13 and the ceramic member 23.

Figure 5B:
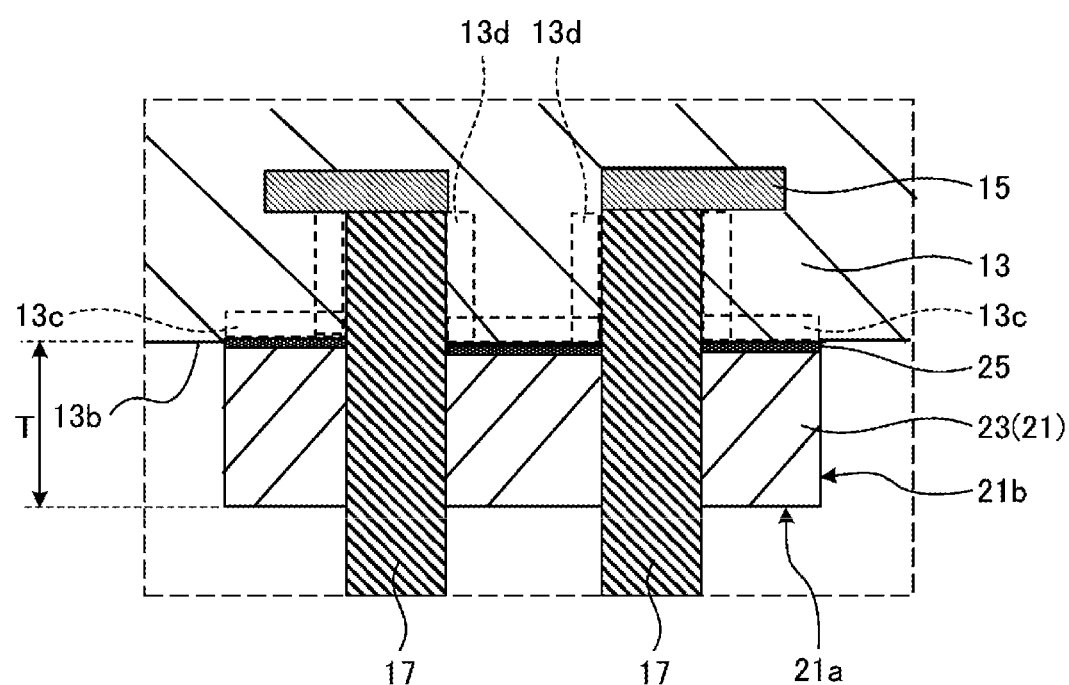
FIG. 5B is an enlarged cross-sectional view of the region III of the heater according to another embodiment.

Next, an eleventh embodiment will be described. In FIG. 5B, a surface portion 13*d* of the base 13 facing the terminal portions 17 is added to the structure in FIG. 3A. The surface portion 13*d* refers to a range from the terminal portions 17 to a depth of 100 μm in a portion of the base 13 facing the terminal portions 17. A content of the metal element B in the surface portion 13*d* of the base 13 facing the terminal portions 17 is greater than the content of the metal element B inside the base 13. Thus, the heater 1 serving as the ceramic structure can efficiently heat the upper surface 13*a* of the base 13, and can improve the bonding strength between the base 13 and the ceramic member 23. Note that a part of the surface portion 13*c* and a part of the surface portion 13*d* may overlap with each other.

Figure 6A:
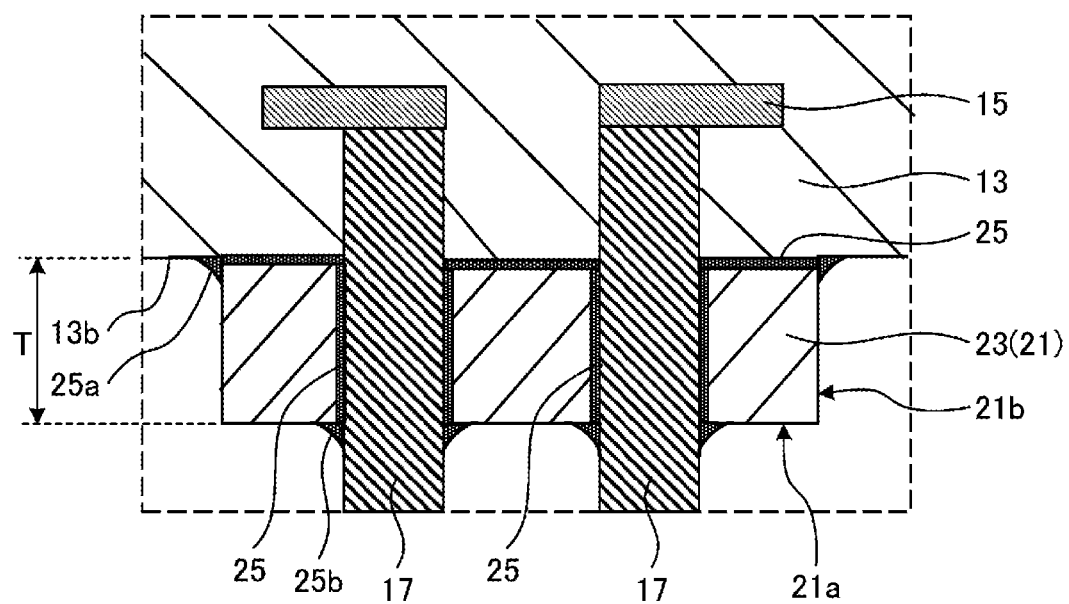
FIG. 6A is an enlarged cross-sectional view of the region III of the heater according to another embodiment.
Figure 7:
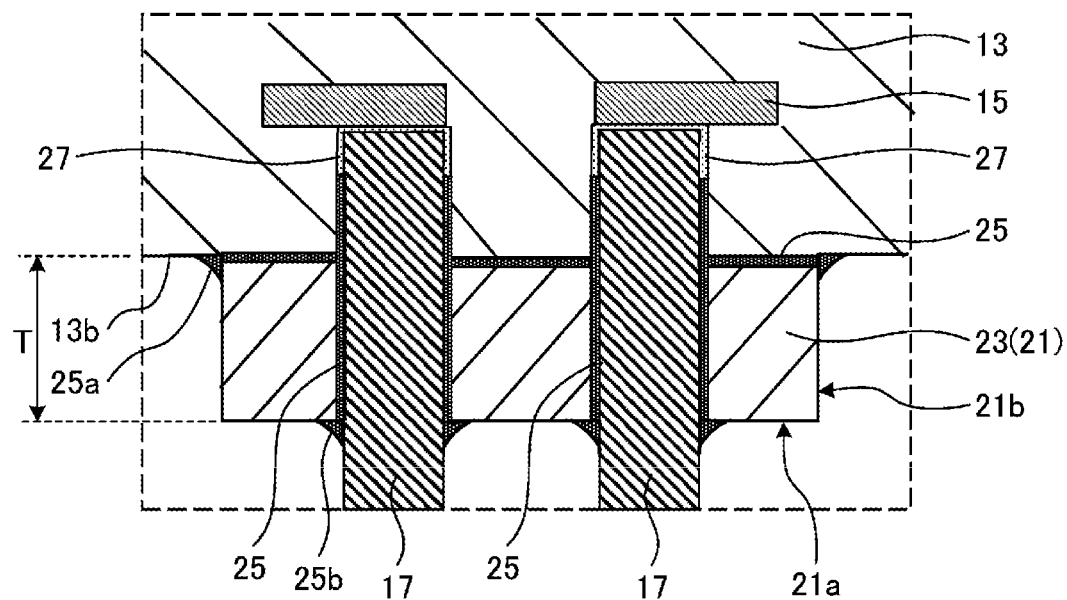
FIG. 7 is an enlarged cross-sectional view of the region III of a heater according to another embodiment.

Next, a twelfth embodiment will be described. As illustrated in FIGS. 3B, 6A, and 7, the bonding member 25 may also be formed between the ceramic member 23 and the terminal portions 17. Thus, the heater 1 serving as the ceramic structure can efficiently heat the upper surface 13*a* of the base 13, and can improve the airtightness between the base 13 and the ceramic member 23.

Next, a thirteenth embodiment will be described. As illustrated in FIG. 6A, the bonding member 25 includes a first extending portion 25*a* extending from a terminal end of a bonding portion between the ceramic member 23 and the base 13. Thus, the heater 1 serving as the ceramic structure can efficiently heat the upper surface 13*a* of the base 13, and can improve the airtightness between the base 13 and the ceramic member 23.

Figure 6B:
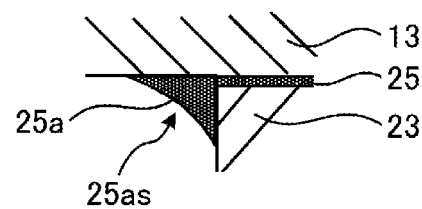
FIG. 6B is an enlarged cross-sectional view of a part in FIG. 6A.

FIG. 6B is an enlarged cross-sectional view of a part in FIG. 6A. A surface 25*as* of the first extending portion 25*a* has a recessed shape. When the surface 25*as* of the first extending portion 25*a* has the recessed shape, the occurrence of cracks in the bonding member 25 can be suppressed.

Figure 6C:
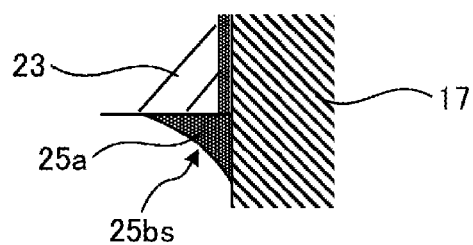
FIG. 6C is an enlarged cross-sectional view of a part in FIG. 6A.

FIG. 6C is an enlarged cross-sectional view of a part in FIG. 6A. A surface 25*bs* of a second extending portion 25*b* has a recessed shape. In a case where the surface 25*bs* of the second extending portion 25*b* has the recessed shape, a sealing effect around the terminal portions 17 is improved.

Next, a fourteenth embodiment will be described. As illustrated in FIG. 6A, the bonding member 25 includes the second extending portion 25*b* extending from the terminal end of the bonding portion between the terminal portions 17 and the ceramic member 23. Thus, the heater 1 serving as the ceramic structure can efficiently heat the upper surface 13*a* of the base 13, and can improve the airtightness between the base 13 and the ceramic member 23.

Next, a fifteenth embodiment will be described. As illustrated in FIG. 7, the heater 1 serving as the ceramic structure includes a metal layer 27 between the base 13 and each of the terminal portions 17 on an end side of a part of each of the terminal portions 17 located in the base 13. A material of the metal layer 27 is preferably any one of W, Mo, Pt, and Ni, and Pt is particularly preferred. According to such a configuration, the heater 1 serving as the ceramic structure can efficiently heat the upper surface 13*a* of the base 13, and can improve the bonding strength between the base 13 and the terminal portions 17. The bonding member 25 and the metal layer 27 are in contact with each other as illustrated in FIG. 7, and thus the airtightness between the base 13 and the terminal portions 17 can be improved.

Note that although not illustrated, in a case where the bonding member 25 and the metal layer 27 are in contact with each other, it is preferable that there is a layer in which the bonding member 25 and the metal layer 27 are mixed. As a result, since the difference in thermal expansion between the bonding member 25 and the metal layer 27 is reduced, the upper surface 13*a* of the base 13 can be efficiently heated, and the airtightness between the base 13 and the terminal portions 17 can be improved.

Figure 8:
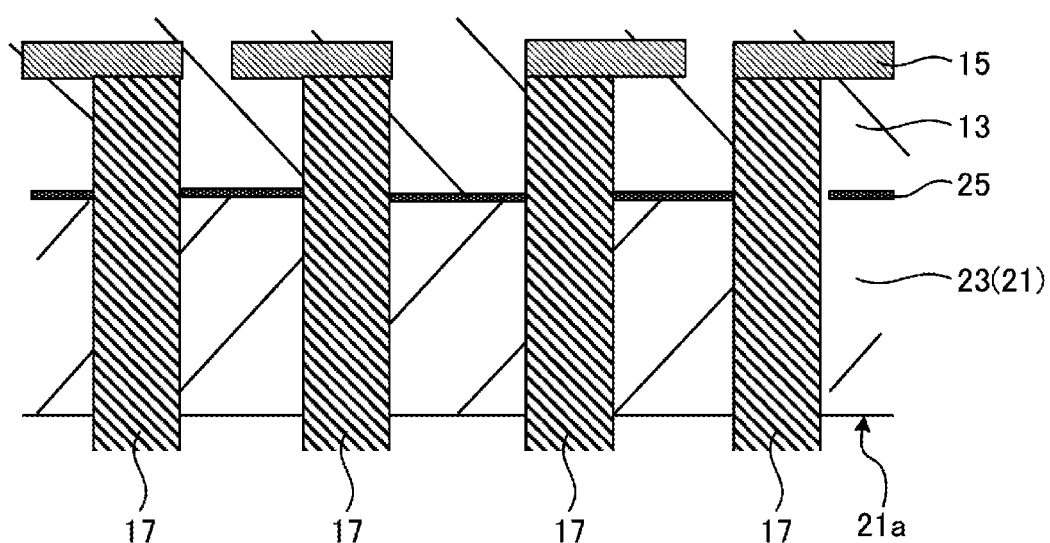
FIG. 8 is an enlarged cross-sectional view of a protruding portion and a terminal portion of a heater according to another embodiment.

Next, a sixteenth embodiment will be described. Three or more terminal portions 17 passing through the ceramic member 23 may be formed in the heater 1 serving as the ceramic structure. In FIG. 8, four terminal portions 17 passing through the ceramic member 23 are illustrated. Since there are three or more terminal portions 17 passing through the ceramic member 23, in the heater 1 serving as the ceramic structure, this can improve the degree of freedom of design of the heater 1 serving as the ceramic structure. Further, since the ceramic member 23 is bonded to the base 13 in a state where the three or more terminal portions 17 are restrained by the ceramic member 23, the upper surface 13a of the base 13 can be efficiently heated and the reliability of bonding between the base 13 and the ceramic member 23 can be improved.

Figure 9:
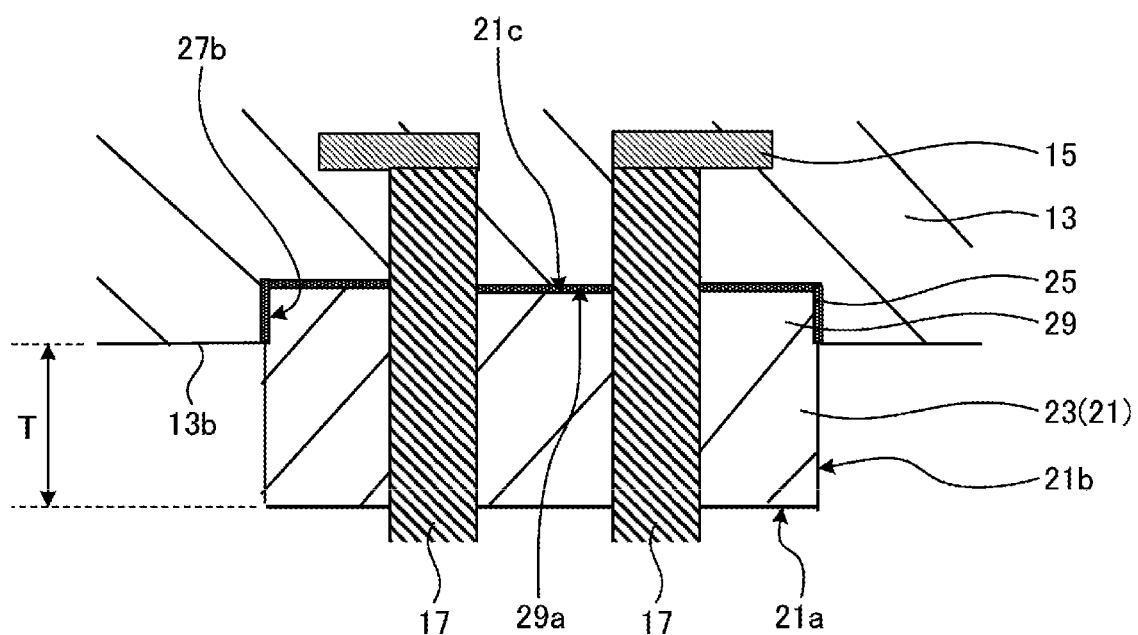
FIG. 9 is an enlarged cross-sectional view of the region III of the heater according to another embodiment.

Next, a seventeenth embodiment will be described. As illustrated in FIG. 9, the heater 1 serving as the ceramic structure includes a recessed portion 29 formed in the lower surface 13b of the base 13, and the ceramic member 23 is bonded to a bottom surface 29a of the recessed portion 29. The protruding portion 21 in FIG. 9 is formed of a part of the ceramic member 23. The protruding portion 21 is formed of a part of the ceramic member 23 protruding from the lower surface 13b to the top surface 21a. The bottom surface 21c of the ceramic member 23 is bonded to the bottom surface 29a of the recessed portion 29 of the base 13, and thus deformation of the ceramic member 23 and the terminal portions 17 is suppressed. Further, since a part of a side surface of each of the terminal portions 17 is bonded by the bonding member 25 at the bottom surface of the recessed portion 29, the airtightness of the terminal portions 17 can be maintained.

As a result, the heater 1 serving as the ceramic structure can efficiently heat the upper surface 13a of the base 13, and can further improve the reliability of the bonding (sealing) between the base 13 and the ceramic member 23.

Next, an eighteenth embodiment will be described. As illustrated in FIG. 9, in the heater 1 serving as the ceramic structure, the ceramic member 23 is bonded to the bottom surface 29a and a side surface 27b of the recessed portion 29 via the bonding member 25. The bonding member 25 may be present on the entirety or a part of the bottom surface 29a and on the entirety or a part of the side surface 27b. According to such a configuration, since the bottom surface 21c and the side surface 21b of the ceramic member 23 are restrained by the bottom surface 29a and the side surface 27b of the recessed portion 29 of the base 13 via the bonding member 25, the deformation of the ceramic member 23 and the terminal portions 17 is suppressed. As a result, the heater 1 serving as the ceramic structure can efficiently heat the upper surface 13a of the base 13, and can further improve the reliability of the bonding (sealing) between the base 13 and the ceramic member 23.

Figure 10:
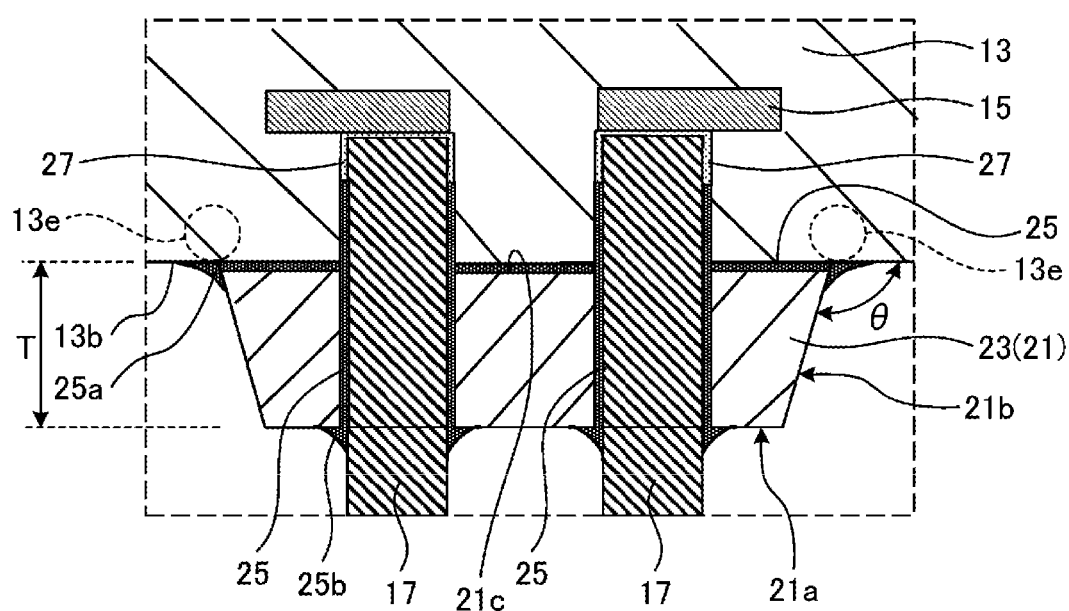
FIG. 10 is an enlarged cross-sectional view of the region III of a heater according to another embodiment.

Next, a nineteenth embodiment will be described. FIG. 10 is an enlarged cross-sectional view of the region III of a heater according to another embodiment. As illustrated in FIG. 10, a cross-sectional shape of the ceramic member 23 may be an inverted trapezoidal shape in which a width gradually narrows from the bottom surface 21c facing the lower surface 13b of the base 13 toward the top surface 21a. In other words, in the ceramic member 23, an area of a cross-section in a direction parallel to the lower surface 13b of the base 13 may be wider than an area of the top surface 21a of the protruding portion 21. According to such a configuration, the amount of heat dissipated to an open end side of the terminal portions 17 is suppressed while the heat dissipation amount is uniform as a whole. Thus, the upper surface 13a of the base 13 can be further efficiently heated.

The side surface 21b of the ceramic member 23 is inclined with respect to the lower surface 13b of the base 13, and this makes it difficult for cracks to occur in the base 13. In other words, for example, in the manufacturing process, after bonding the ceramic member 23 to the lower surface 13b of the base 13 by the bonding member 25, when they are subjected to thermal treatment, cracks may occur in the bonding location between the base 13 and the ceramic member 23. Specifically, cracks are likely to occur in the base 13 at a bonding location 13e between the base 13 and the peripheral edge portion of the bottom surface 21c of the ceramic member 23. The reason for this is considered to be that stress concentrates on the bonding location 13e due to an influence of the protruded bonding member 25 (first extending portion 25a).

In contrast, in a case where the side surface 21b of the ceramic member 23 is inclined with respect to the lower surface 13b of the base 13, the protruded bonding member 25 (first extending portion 25a) spreads along the side surface 21b, and thus, an amount of the bonding member 25 in the vicinity of the bonding location 13e is reduced compared to a case where the side surface 21b is not inclined. As a result, the stress concentration at the bonding location 13e is suppressed, and thus the occurrence of cracks in the base 13 is suppressed.

In a case where the first extending portion 25a has a recessed surface, the stress applied to the first extending portion 25a decreases, and thus the occurrence of cracks in the bonding member 25 with the first extending portion 25a as a starting point can be suppressed. As a result, the airtightness between the base 13 and the ceramic member 23 can be improved by the bonding member 25.

An angle θ formed between the lower surface 13b of the base 13 and the side surface 21b of the ceramic member 23 may be, for example, from 100° to 150°.

Note that in the ceramic member 23 illustrated in FIG. 10, a cross-sectional area parallel to the lower surface 13b of the base 13 changes in a thickness direction of the ceramic member 23. Even in this case, in the ceramic member 23, when the line segment formed of the virtual straight line is drawn on the contour of the cross-section and inside the contour at each cross-section, the maximum value of the length of the line segment is preferably greater than the thickness T.

Figure 11:
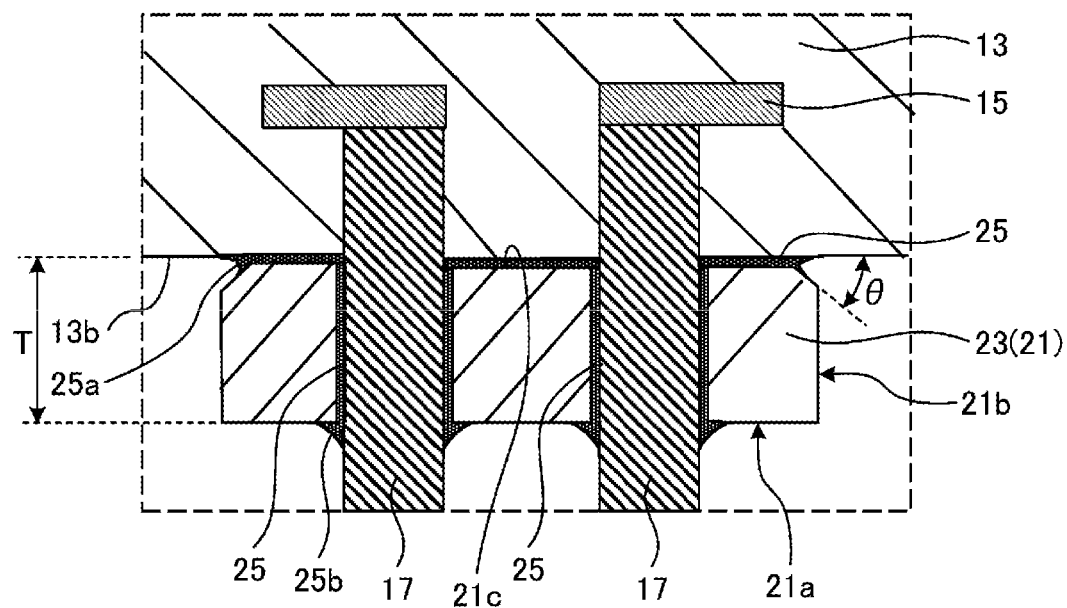
FIG. 11 is an enlarged cross-sectional view of the region III of a heater according to another embodiment.

Next, a twentieth embodiment will be described. FIG. 11 is an enlarged cross-sectional view of the region III of a heater according to another embodiment. As illustrated in FIG. 11, in the side surface 21b of the ceramic member 23, only a part of a region including a first end (end portion closer to the bottom surface 21c) closer to the lower surface 13b of the base 13 may be inclined. Here, an example is illustrated in which a width of a part (inclined portion) of the side surface 21b of the ceramic member 23 gradually narrows toward the bottom surface 21c of the ceramic member 23. In other words, here, an example is illustrated in which the angle θ formed between the lower surface 13b of the base 13 and the inclined portion of the side surface 21b of the ceramic member 23 is an acute angle.

In this case as well, the protruded bonding member 25 (first extending portion 25a) spreads along the side surface 21b, and thus, the amount of the bonding member 25 in the vicinity of the bonding locations 13e is reduced compared to the case where the side surface 21b is not inclined. As a result, the stress concentration at the bonding location 13e is suppressed, and thus the occurrence of cracks in the base 13 is suppressed.

As described above, the side surface 21b of the ceramic member 23 may be inclined with respect to the lower surface 13b of the base 13 in at least the part of the region including the first end closer to the lower surface 13b of the base 13.

Figure 12:
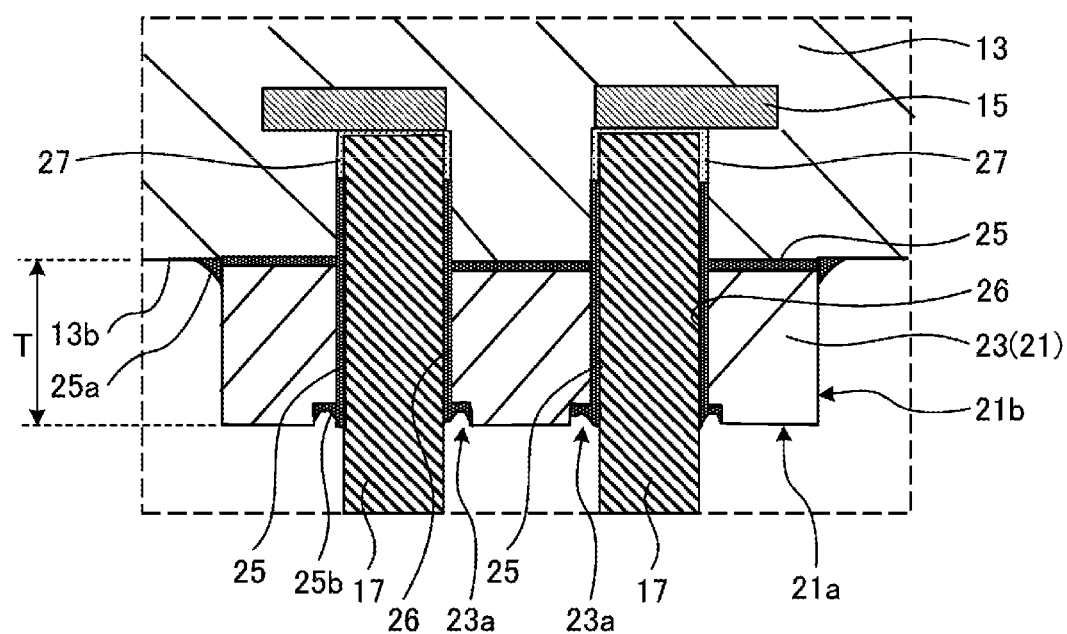
FIG. 12 is an enlarged cross-sectional view of the region III of the heater according to another embodiment.

Next, a twenty-first embodiment will be described. FIG. 12 is an enlarged cross-sectional view of the region III of a heater according to another embodiment. As illustrated in FIG. 12, the ceramic member 23 may include a recessed portion 23a around each of the through holes 26 on the top surface 21a. In this case, the second extending portion 25b may be located in the recessed portion 23a.

According to this configuration, since a bonding area between the ceramic member 23 and the terminal portions 17 in the second extending portion 25b increases, the airtightness between the ceramic member 23 and the terminal portions 17 can be further improved. In turn, the airtightness between the base 13 and the ceramic member 23 can be further improved.

Figure 13:
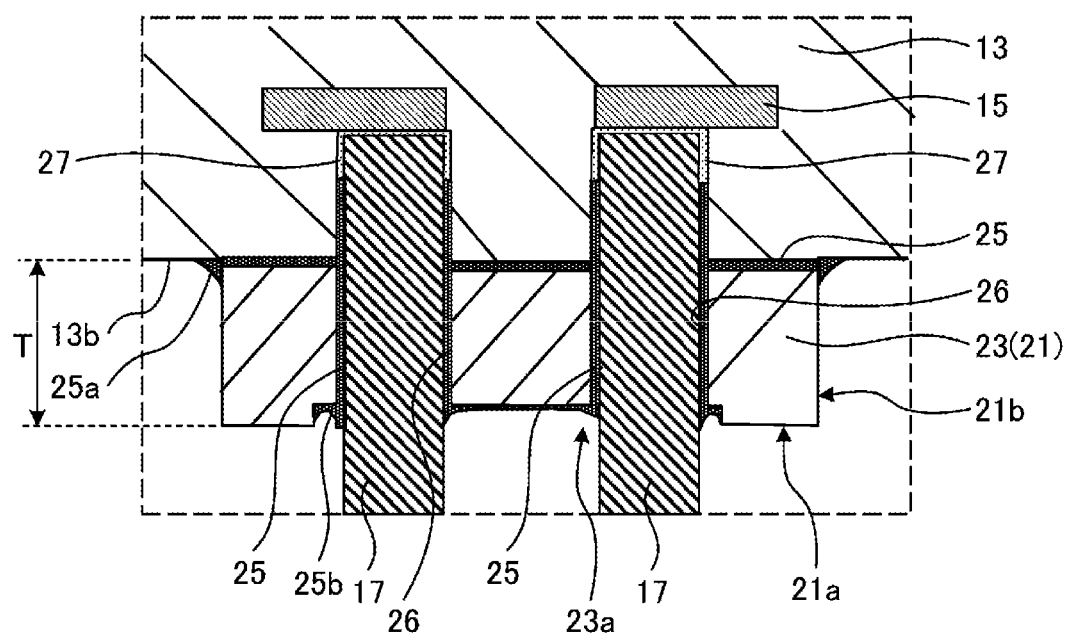
FIG. 13 is an enlarged cross-sectional view of the region III of a heater according to another embodiment.

Next, a twenty-second embodiment will be described. FIG. 13 is an enlarged cross-sectional view of the region III of a heater according to another embodiment. As illustrated in FIG. 13, the recessed portion 23a may surround at least two of a plurality of the through holes 26. In FIG. 13, an example is illustrated in which the ceramic member 23 includes two through holes 26, and the recessed portion 23a is formed so as to surround the two through holes 26. In this case, the second extending portion 25b may be located in the recessed portion 23a.

According to this configuration, since the bonding area between the ceramic member 23 and the terminal portions 17 in the second extending portion 25b further increases, the airtightness between the ceramic member 23 and the terminal portions 17 can be further improved. In turn, the airtightness between the base 13 and the ceramic member 23 can be further improved.

Figure 14:
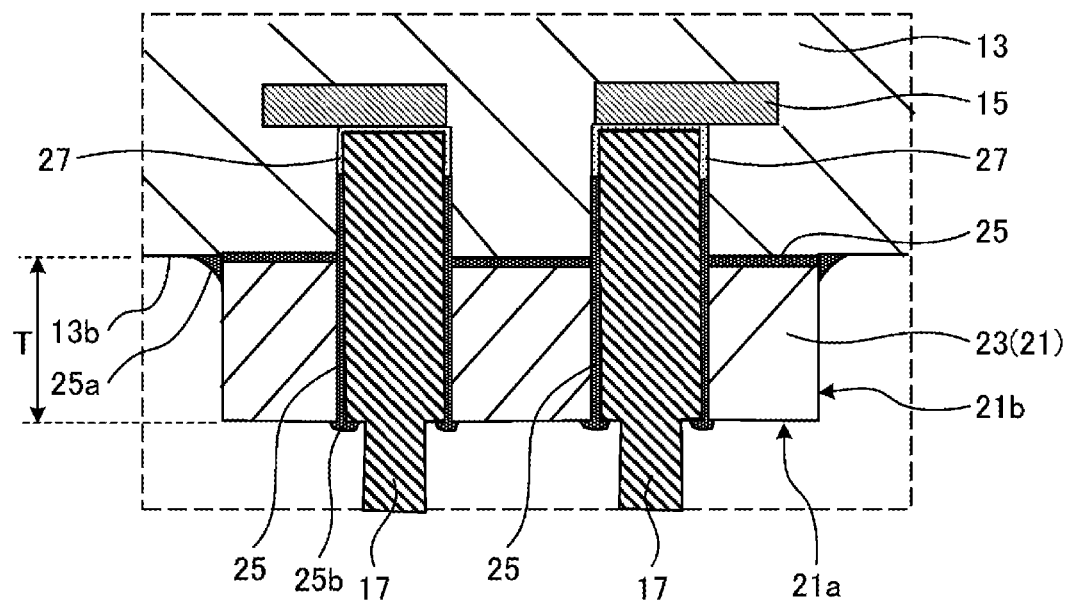
FIG. 14 is an enlarged cross-sectional view of the region III of a heater according to another embodiment.

Next, a twenty-third embodiment will be described. FIG. 14 is an enlarged cross-sectional view of the region III of a heater according to another embodiment. As illustrated in FIG. 14, each of the terminal portions 17 may have a diameter (cross-sectional area) of a part exposed from the top surface 21a of the protruding portion 21 less than a diameter (cross-sectional area) of a part embedded in the protruding portion 21. In this case, the second extending portion 25b may be located so as to extend across a stepped surface between a large diameter part and a small diameter part of each of the terminal portions 17 and the top surface 21a of the ceramic member 23.

According to this configuration, since the bonding area between the ceramic member 23 and the terminal portions 17 in the second extending portion 25b further increases, the airtightness between the ceramic member 23 and the terminal portions 17 can be further improved. In turn, the airtightness between the base 13 and the ceramic member 23 can be further improved.

Figure 15:
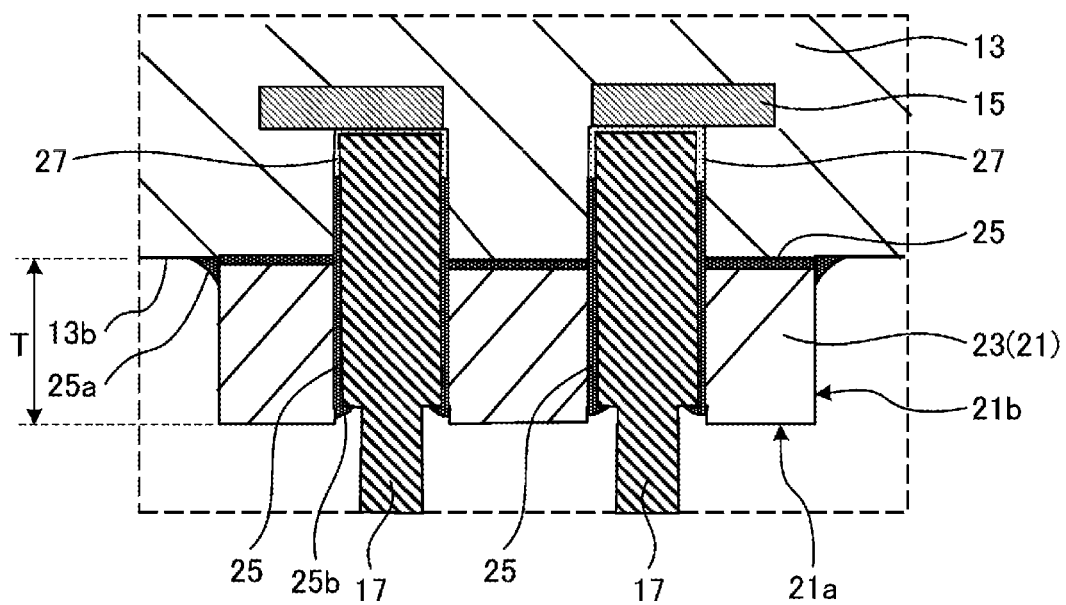
FIG. 15 is an enlarged cross-sectional view of the region III of the heater according to another embodiment.

Next, a twenty-fourth embodiment will be described. FIG. 15 is an enlarged cross-sectional view of the region III of a heater according to another embodiment. As illustrated in FIG. 15, the stepped surface between the large diameter part and the small diameter part of each of the terminal portions 17 may be embedded in the protruding portion 21. In other words, the stepped surface between the large diameter part and the small diameter part of each of the terminal portions 17 may be located inside a corresponding one of the through holes 26. Also in this case, the airtightness between the ceramic member 23 and the terminal portions 17 can be further improved, and in turn the airtightness between the base 13 and the ceramic member 23 can be further improved.

Figure 16A:
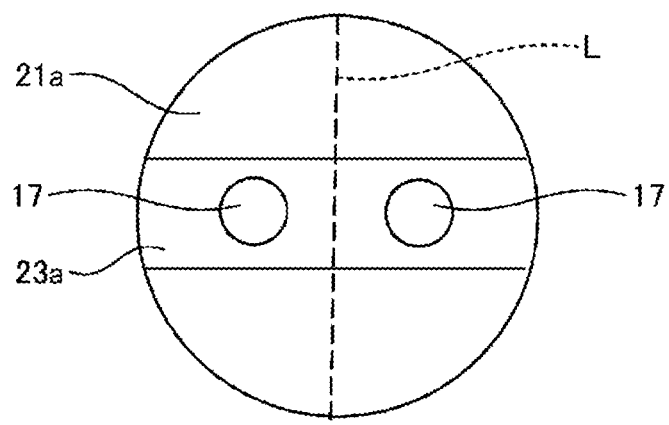
FIG. 16A is a top view of the region III of the heater according to another embodiment.
Figure 16B:
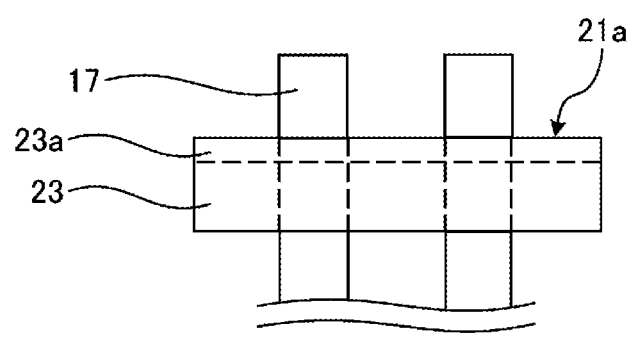
FIG. 16B is a side view of the region III of the heater according to another embodiment.

Next, a twenty-fifth embodiment will be described. FIG. 16A is a top view of the region III of the heater according to another embodiment. FIG. 16B is a side view of the region III of the heater according to another embodiment. Note that in FIGS. 16A and 16B, the bonding member 25 and the like are omitted.

As illustrated in FIGS. 16A and 16B, the recessed portion 23a formed in the top surface 21a of the ceramic member 23 may have a groove shape in which both ends are located on an outer edge of the ceramic member 23. Here, an example is illustrated in which the recessed portion 23a has the groove shape linearly extending from a first end portion to a second end portion.

Figure 17:
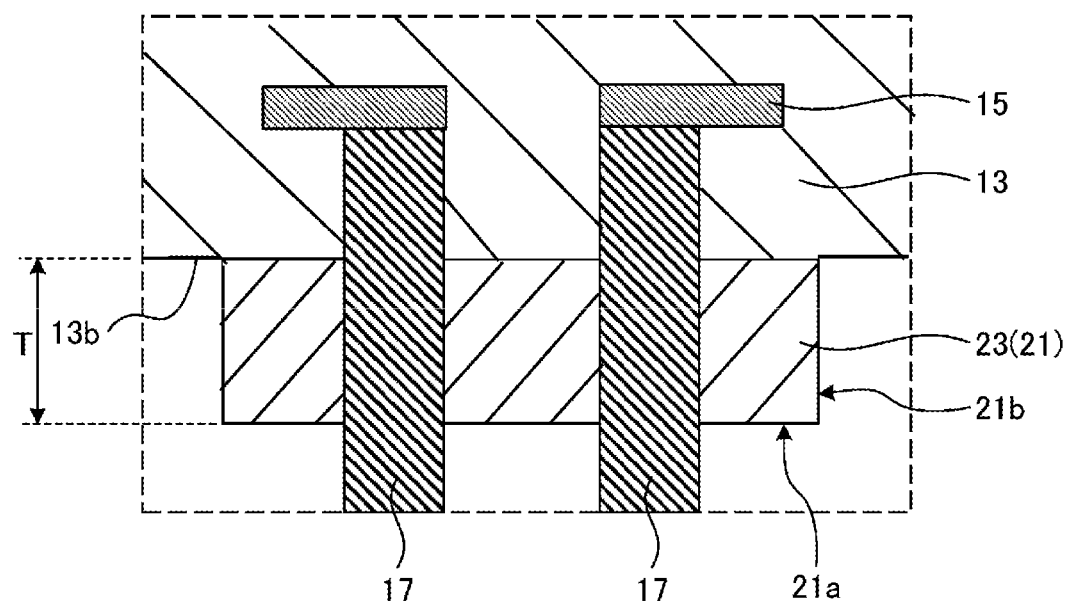
FIG. 17 is an enlarged cross-sectional view of the region III of the heater according to another embodiment.

Next, a twenty-sixth embodiment will be described. FIG. 17 is an enlarged cross-sectional view of the region III of the heater according to another embodiment. As illustrated in FIG. 17, the protruding portion 21 may be bonded to the base 13 without the bonding member 25. In this case, the protruding portion 21 may be bonded to the base 13 by, for example, the solid phase bonding. The protruding portion 21 may be bonded to the base 13 by the diffusion bonding.

Figure 18:
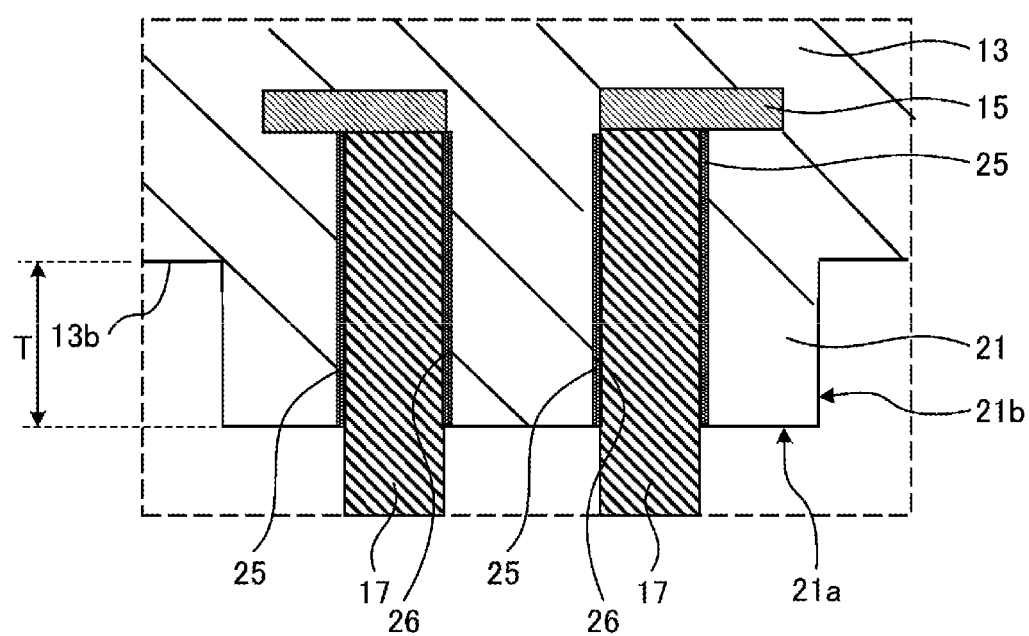
FIG. 18 is an enlarged cross-sectional view of the region III of the heater according to another embodiment.

Next, a twenty-seventh embodiment will be described. FIG. 18 is an enlarged cross-sectional view of the region III of the heater according to another embodiment. As illustrated in FIG. 18, the protruding portion 21 may be formed integrally with the base 13. In this case, the ceramic member 23 and the terminal portions 17 may be bonded by the bonding member 25. Since the airtightness can be maintained by sealing a gap between the ceramic member 23 and the terminal portions 17, for example, even when the terminal portions 17 are exposed to an oxidizing gas (for example, oxygen gas) at a high temperature, the oxygen gas does not enter from the periphery of the terminal portions 17, and thus the resistive heating body 15 is not oxidized.

A manufacturing method of each of the heaters serving as the ceramic structure according to a corresponding one of the second embodiment to the twenty-fifth embodiment may basically be similar to the manufacturing method of the heater according to the first embodiment.

The heater according to the twenty-sixth embodiment differs from the manufacturing method of the heater according to the first embodiment in that the protruding portion 21 is bonded to the base 13 without the bonding member 25. To manufacture the heater according to the twenty-sixth embodiment, the ceramic member 23 including the through holes 26 is manufactured, the formed ceramic member 23 is bonded to the lower surface 13b of the base 13, and each of the terminal portions 17 is passed through the corresponding one of the through holes 26 of the ceramic member 23. As a method for bonding the protruding portion 21 and the lower surface 13b to each other without using the bonding member 25, for example, the solid phase bonding or the diffusion bonding is used.

The heater according to the twenty-seventh embodiment differs from the manufacturing method of the heater according to the first embodiment in that the protruding portion 21 is formed integrally with the base 13. To manufacture the heater according to the twenty-seventh embodiment, when the second insulating layer 19B (see FIG. 1) is manufactured, the protruding portion 21 may be formed integrally with the second insulating layer 19B. When each of the terminal portions 17 is passed through the corresponding one of through holes 26, the paste of the bonding member 25 is applied to the through holes 26. Accordingly, after each of the terminal portions 17 is inserted through the corresponding one of the through holes 26, the gaps between the bonding member 25 and the terminal portions 17 are sealed by the bonding member 25 by heat treatment in vacuum.

The description of the manufacturing method of each of the heaters serving as the ceramic structure from the second embodiment to the fifth embodiment is omitted since the shape of the protruding portion may be manufactured in accordance with each embodiment. Manufacturing methods of the heaters serving as the ceramic structures from the sixth embodiment to the eighteenth embodiment will be described below.

Note that, the description may be omitted for contents overlapping with the manufacturing method of the ceramic structure of the first embodiment or the like. Among the manufacturing methods of the heaters according to the embodiments described later, contents overlapping with the manufacturing methods of the heaters according to previously described embodiments are omitted unless otherwise specified.

To manufacture the heater according to the sixth embodiment, the heater may be manufactured such that the materials of the base 13 and the ceramic member 23 are the same.

To manufacture the heater according to the seventh embodiment, the heater may be manufactured such that the bonding member 25 includes the metal element A constituting the main component of the base 13 and the metal element B constituting the sintering aid included in the base 13, and the sum of the metal element A and the metal element B constitutes the main component of the bonding member 25.

To manufacture the heater according to the eighth embodiment, the heater may be manufactured using the base in which the metal element A constituting the main component of the base 13 is Al, and the metal element B constituting the sintering aid included in the base 13 is Y and Ca.

To manufacture the heater according to the ninth embodiment, the heater may be manufactured such that the main component of the base 13 and the ceramic member 23 is aluminum nitride (AlN), and the metal element B constituting the sintering aid of the base 13 (AlN) is yttrium (Y) and calcium (Ca).

To manufacture the heater according to the tenth embodiment, the heater is manufactured using the base 13 in which the content of the metal element B in a portion constituting the surface portion 13c is greater than the content of the metal element B inside the base 13. Specifically, in layering a plurality of unfired ceramic raw sheets, the sheets may be layered and integrated such that the content of the metal element B in a portion constituting the surface portion 13c is greater than the content of the metal element B inside the base 13 after firing, and then fired.

To manufacture the heater according to the eleventh embodiment, the heater may be manufactured such that the content of the metal element B in the surface portion 13d of the base 13 facing the terminal portions 17 is greater than the content of the metal element B inside the base 13. Specifically, in layering the plurality of unfired ceramic raw sheets, the sheets may be layered and integrated such that the content of the metal element B in the portion constituting the surface portion 13d is greater than the content of the metal element B inside the base 13 after firing, and then fired.

To manufacture the heater according to the twelfth embodiment, the heater may be manufactured by forming the bonding member 25 between the terminal portions 17 and the ceramic member 23 by application or the like, and performing heating to bond the terminal portions 17 and the ceramic member 23 to each other.

To manufacture the heater according to the thirteenth embodiment, when the bonding member 25 is applied, the bonding member may also be formed in the first extending portion 25a.

To manufacture the heater according to the fourteenth embodiment, the bonding member may also be formed in the second extending portion 25b.

To manufacture the heater according to the fifteenth embodiment, a paste for forming the metal layer 27 may be formed by application or the like on the end side of the part of each of the terminal portions 17 located in the base 13, subsequently the paste of the metal layer 27 may be heated in a state of being brought into contact with the resistive heating body 15 to melt the metal layer 27, and the metal layer 27 is formed between the base 13 and the terminal portions 17.

To manufacture the heater according to the sixteenth embodiment, the heater may be manufactured by forming two or more through holes in the ceramic member 23 and inserting each of the terminal portions 17 into a corresponding one of the through holes.

A manufacturing method of the heater according to the seventeenth embodiment is as follows. The ceramic member 23 thicker than a depth of the recessed portion 29 of the base 13 and having a shape in which the ceramic member 23 is allowed to be inserted into the recessed portion 29 is prepared. The recessed portion 29 is formed in the lower surface 13b of the base 13 by machining or the like. The ceramic member 23 is inserted into the recessed portion 29 so as to be in contact with the bottom surface 29a of the recessed portion 29. Then, the ceramic member 23 is heated by hot press in a state of being pressurized against the bottom surface 29a of the recessed portion 29, and is subjected to the diffusion bonding.

A manufacturing method of the heater according to the eighteenth embodiment is as follows. The bonding member 25 is formed on the bottom surface 29a and the side surface 27b of the recessed portion 29 by the application or the like, and the ceramic member 23 is inserted into the recessed portion 29. Thereafter, the resultant is heated so that the recessed portion 29 and the ceramic member 23 are bonded to each other via the bonding member 25.

In a manufacturing method of each of the heaters according to the nineteenth to twenty-second embodiments, the twenty-fourth embodiment, and the twenty-fifth embodiment, the shape of the protruding portion 21 may be manufactured in accordance with each embodiment. For example, the protruding portions 21 according to the nineteenth embodiment and the twentieth embodiment differ from the protruding portion 21 according to the first embodiment in the shape of the side surface 21b. This shape can be obtained by, for example, firing the layered body of the ceramic green sheet and subsequently machining the side surface of the fired body. The protruding portions 21 according to the twenty-first embodiment, the twenty-second embodiment, and the twenty-fifth embodiment differ from the protruding portion 21 according to the first embodiment in that the top surface 21a of the protruding portion 21 includes the recessed portion 23a. This shape can be obtained by, for example, firing the layered body of the ceramic green sheet, and subsequently machining the top surface of the fired body.

To manufacture the heater according to the twenty-third embodiment, the terminal portions 17 each having the large diameter part and the small diameter part are prepared, and each of the terminal portions 17 is inserted through the corresponding one of the through holes 26 until the stepped surface between the large diameter part and the small diameter part is located flush with the lower surface 21a. To manufacture the heater according to the twenty-fourth embodiment, the terminal portions 17 each having the large diameter part and the small diameter part are prepared, and each of the terminal portions 17 is inserted through the corresponding one of the through holes 26 until the stepped surface between the large diameter part and the small diameter part is located inside the corresponding one of the through holes 26.

To manufacture the heaters according to the nineteenth to twenty-fourth embodiments, when the bonding member 25 is applied, the bonding member may also be formed in the extending portions (the first extending portion 25a and the second extending portion 25b).

The heater according to the present disclosure is not limited to the above-described embodiments, and may be implemented in various aspects. In the embodiments, the ceramic heater having a heating function is taken as the example as the ceramic structure. However, the ceramic structure may have other functions. For example, the ceramic structure may be a structure for an electrostatic chuck, or plasma generation, or may function serving as a combination of two or more of these and the heater.

In other words, the internal conductor is the resistive heating body for heating in the embodiments, but may be a conductor for other applications, and may be, for example, an electrode for the electrostatic chuck, or an electrode for the plasma generation. The ceramic structure may include one or a combination of two or more of these electrodes and the resistive heating body. The internal conductor is a conductor having a shape, for example, spread along the upper surface of the base (facing upward). For example, when assuming a minimum convex curved line surrounding the entirety of the internal conductor in a plan view, a region surrounded by the convex curved line occupies 60% or greater or 80% or greater of the upper surface of the base.

REFERENCE SIGNS LIST

1 Heater (Ceramic structure)
3 Electrical power supply unit
5 Controller
7 Wiring member
9 Heater plate
11 Pipe
11s Space
13 Base, 13a Upper surface, 13b Lower surface
13c, 13d Region with high content of metal element B
15 Resistive heating body (Internal conductor)
17 Terminal portion
19A First insulating layer
19B Second insulating layer
21 Protruding portion
21a Top surface
21b Side surface
21c Bottom surface
23 Ceramic member
25 Bonding member
25a, 25b Extending portion
27 Recessed portion
27a Bottom surface
27b Side surface
101 Heater system
T Thickness
L Line segment

The invention claimed is:

1. A ceramic structure comprising:
a base formed of ceramic and having a plate shape, the base comprising an upper surface on which a wafer is superposed and a lower surface opposite to the upper surface;
an internal conductor located in the base;
a protruding portion formed on the lower surface of the base;
a terminal portion electrically connected to the internal conductor, at least partly located in the base and in the protruding portion, and exposed to an outside of the protruding portion; and
a pipe extending from the lower surface, wherein
the protruding portion is formed of a ceramic member,
the terminal portion passes through a through hole formed in the ceramic member,
the protruding portion includes a top surface and a side surface connected to the top surface,
the top surface is located farther away from the upper surface than the lower surface, and
the ceramic member is bonded to at least one of the lower surface of the base and the terminal portion and is located inside the pipe.

2. The ceramic structure according to claim 1, wherein the protruding portion has a contour of any one of a circle, an ellipse, and a polygon in a cross-section parallel to the lower surface.

3. The ceramic structure according to claim 2, wherein when a line segment formed of a virtual straight line is drawn on the contour and inside the contour, a maximum value of a length of the line segment is greater than a thickness of the protruding portion.

4. The ceramic structure according to claim 1, wherein an area of a cross-section of the protruding portion in a direction parallel to the lower surface is wider than an area of a top surface of the protruding portion.

5. The ceramic structure according to claim 3, wherein a side surface of the ceramic member is inclined with respect to the lower surface in at least a part of a region comprising a first end closer to the lower surface.

6. The ceramic structure according to claim 1, wherein the ceramic member is bonded to at least one of the lower surface and the terminal portion via a bonding member.

7. The ceramic structure according to claim 6, wherein the bonding member comprises a metal element A constituting a main component of the base and a metal element B constituting a sintering aid comprised in the base, and
the sum of the metal element A and the metal element B constitutes a main component of the bonding member.

8. The ceramic structure according to claim 7, wherein the metal element A is Al, and
the metal element B is Y and Ca.

9. The ceramic structure according to claim 8, wherein the main component of the base is formed of AlN.

10. The ceramic structure according to claim 7, wherein a content of the metal element B in a surface portion of the base facing the ceramic member is greater than a content of the metal element B inside the base.

11. The ceramic structure according to claim 10, wherein the bonding member is formed between the base and the terminal portion located in the base, and
a content of the metal element B in a surface portion of the base facing the terminal portion is greater than the content of the metal element B inside the base.

12. The ceramic structure according to claim 10, wherein the bonding member is formed between the ceramic member and the terminal portion.

13. The ceramic structure according to claim 6, wherein the bonding member comprises a first extending portion extending from a terminal end of a bonding portion between the ceramic member and the base.

14. The ceramic structure according to claim 6, wherein the bonding member comprises a second extending portion extending from a terminal end of a bonding portion between the terminal portion and the ceramic member.

15. The ceramic structure according to claim 1, wherein the ceramic member is formed of ceramic comprising the same material as a material of the base.

16. The ceramic structure according to claim 1, wherein the ceramic structure is used for a heating device configured to heat an object by causing the internal conductor to heat up.

17. A ceramic structure comprising:
a base formed of ceramic and having a plate shape, the base comprising an upper surface on which a wafer is superposed and a lower surface opposite to the upper surface;
an internal conductor located in the base;
a protruding portion formed on the lower surface of the base; and
a terminal portion electrically connected to the internal conductor, at least partly located in the base and in the protruding portion, and exposed to outside the protruding portion, wherein
the protruding portion is formed of a ceramic member,
the terminal portion passes through a through hole formed in the ceramic member, and
the ceramic member is bonded to at least one of the lower surface of the base and the terminal portion, wherein the protruding portion has a contour of any one of a circle, an ellipse, and a polygon in a cross-section parallel to the lower surface, wherein
when a line segment formed of a virtual straight line is drawn on the contour and inside the contour, a maximum value of a length of the line segment is greater than a thickness of the protruding portion, wherein
the ceramic member comprises a recessed portion around the through hole at the top surface of the protruding portion.

18. The ceramic structure according to claim 17, further comprising:
a plurality of the terminal portions, wherein
the ceramic member comprises a plurality of the through holes, and
the recessed portion surrounds at least two of the plurality of the through holes.

19. The ceramic structure according to claim 17, wherein the recessed portion has a groove shape, both ends of the groove shape being located on an outer edge of the ceramic member.

20. A wafer system comprising:
the ceramic structure according to claim 1;
an electrical power supply unit configured to supply electrical power to the terminal portion; and
a controller configured to control the electrical power supply unit.

* * * * *